(12) United States Patent
Schaffer et al.

(10) Patent No.: US 6,636,096 B2
(45) Date of Patent: Oct. 21, 2003

(54) UPSCALED CLOCK FEEDS MEMORY TO MAKE PARALLEL WAVES

(76) Inventors: Bernhard Schaffer, Ottenbergstrasse 29, CH-8572 Berg/TG (CH); Daniel Thommen, Zimmergasse 17, CH-8008 Zurich (CH); Joannes Christianus Drenth, Niederfeldstrasse 33, CH-8932 Mettmenstetten (CH)

( * ) Notice: Subject to any disclaimer, the term of this patent is extended or adjusted under 35 U.S.C. 154(b) by 219 days.

(21) Appl. No.: 09/969,715

(22) Filed: Oct. 3, 2001

(65) Prior Publication Data

US 2002/0052071 A1 May 2, 2002

(30) Foreign Application Priority Data

Oct. 6, 2000 (EP) .......................................... 00203483 U

(51) Int. Cl.[7] .............................. G06F 1/04; H03K 3/00
(52) U.S. Cl. ......................... 327/295; 327/291; 327/296
(58) Field of Search ............................... 327/291, 295, 327/296, 297, 298, 141, 144

(56) References Cited

U.S. PATENT DOCUMENTS

| | | | | |
|---|---|---|---|---|
| 4,122,309 A | * | 10/1978 | Jacobsen ..................... | 370/498 |
| 4,306,190 A | * | 12/1981 | Beckwith et al. ............ | 327/295 |
| 4,553,100 A | | 11/1985 | Nishiura ...................... | 327/160 |
| 4,855,681 A | * | 8/1989 | Millham ...................... | 327/176 |
| 5,517,147 A | * | 5/1996 | Burroughs et al. .......... | 327/295 |
| 5,583,450 A | | 12/1996 | Trimberger et al. .......... | 326/41 |

OTHER PUBLICATIONS

Yamaguchi et al: "A new timing generator IC for a CCD imager" IEEE 1988 International Conference On Consumer Electronics (ICCE), pp. 56–57.

* cited by examiner

Primary Examiner—Tuan T. Lam

(57) ABSTRACT

An integrated circuit has a clock input for receiving a primary clock signal, clock reconfiguring device fed by the clock input for generating one or more secondary reconfigured clock signals, and utility circuitry fed by the clock reconfiguring device for constituting application utility functions under synchronization by the secondary clock signals. In particular, the clock input a clock upscaling device for from the primary clock signal generating an intermediate clock signal with an upscaled frequency for thereby feeding the clock reconfiguring device. Furthermore, the clock reconfiguring device a has late-programmable and low power memory driven by the intermediate clock signal for generating the secondary reconfigured clock signals. These are wave-shape patterns read-out from a plurality of separately and sequentially drivable memory locations.

8 Claims, 2 Drawing Sheets

UPSCALED CLOCK FEEDS MEMORY TO MAKE PARALLEL WAVES

BACKGROUND OF THE INVENTION

The invention relates to an integrated circuit as recited in the preamble of claim 1. Today's integrated circuits, and in particular those for use in telecom applications are provided with a plurality of different clock domains that each run at different dedicated high frequencies. This is done in particular for power saving reasons. As an underlying condition, the clock input for the overall device should be in a relatively low frequency range. Requirements to the various circuitry clocks will often change repeatedly during the design process, which then will cause appreciable delay to the commercial introduction of such circuits. Earlier designs have encompassed a power-consuming full-featured block solution, which especially for portable and battery-powered standalone applications is unattractive for users.

SUMMARY TO THE INVENTION

In consequence, amongst other things, it is an object of the present invention to allow driving the various application utility circuitry functions at their respective optimum reconfigured clock signals whilst making these latter clock signals programmable until at a late stage of the design process, wilst furthermore requiring no more than a low-frequency primary clock frequency source. Now therefore, according to one of its aspects the invention is characterized according to the characterizing part of claim 1. Inter alia, it has been found that power consumption may be reduced by a factor of 5–10.

A further object of the present invention is to allow reconfigured clock signals that have wave-shape patterns defined for various different duty cycles and/or non-standard wave shapes. A still further object of the present invention is to improve testability, which improvement is attained indeed through the overall reduced functionality of the clock generation block.

Further advantageous aspects of the invention are recited in dependent claims.

BRIEF DESCRIPTION OF THE DRAWINGS

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
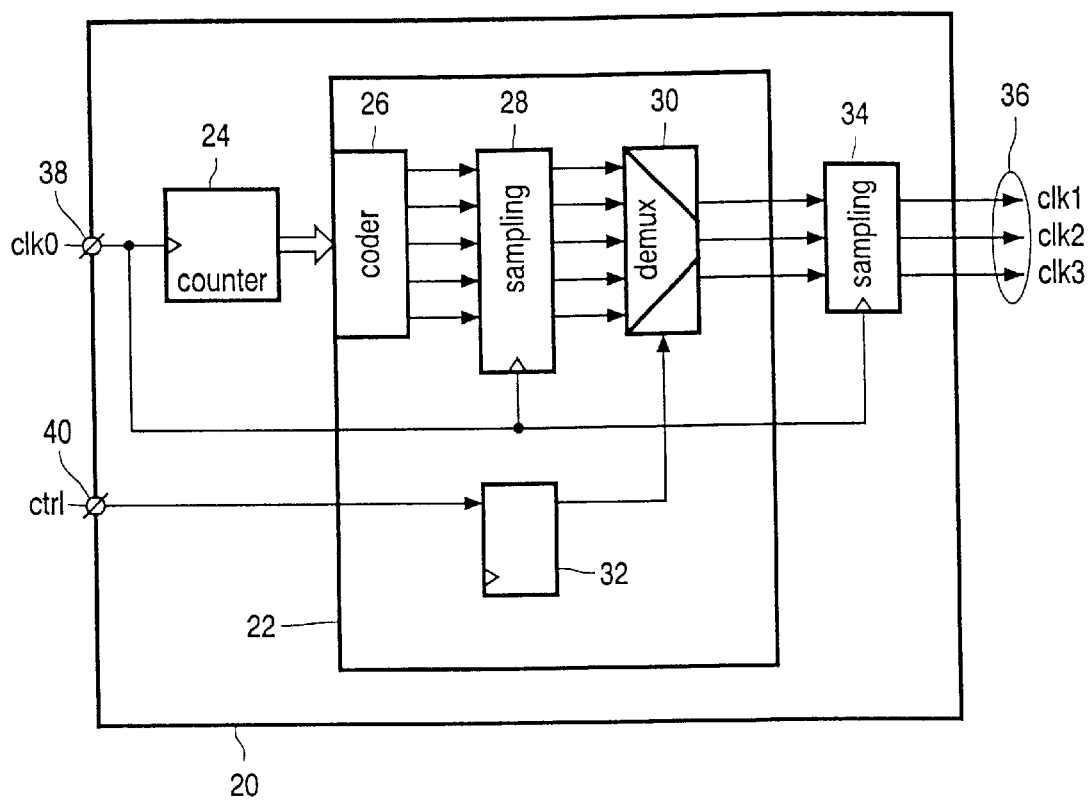
FIG. 1 illustrates a state-of-the-art clock generation unit.

FIG. 1 illustrates a state-of-the-art clock generation unit. The clock generation chip 20 has a standard-cell approach of coding, resampling, and multiplexing the various needed integrated circuit clocks. A control signal ctrl on terminal 40 will allow a user to select between various different clock frequencies. A block designer will generally keep this area very flexible to allow such switching to another frequency until relatively late in the design process if necessary. This approach will lead to a high-power-consuming solution, because the input clock frequency on terminal 38 must be high. Moreover, the coding time will increase and will generally require additional sampling stages. In operation, the input clock drives a counter 24, that feeds the pattern generation proper in block 22 and first selects the various coding facilities in coder 26. The multiple outputs from coder 26 are sampled in sampler 28 under additional clock synchronization from input 38. The sampling outputs are demultiplexed in demux 30 and further sampled in sampling 34, again under synchronizing by the clock on input 38. This will then produce respective clock signals in parallel on multiple output 36. The control signal on control input 40, further synchronized in synchronizer stage 32 under clock control not specified for simplicity, selectively activates demultiplexer 30.

Figure 2:
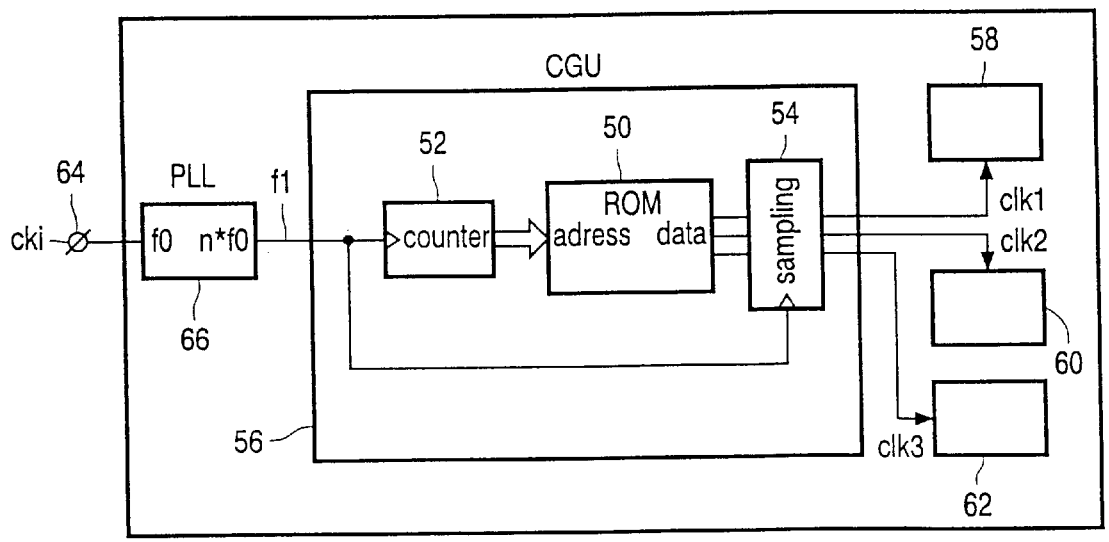
FIG. 2, a ROM-based embodiment according to the present invention.

FIG. 2 illustrates a ROM-based embodiment according to the present invention, that is optimized from both an area point of view, and from a power consumption point of view. Now first, in normal usage of the IC applications, the control signal ctrl (40) in FIG. 1 will remain stable. A first improvement is therefore attained by abandoning the control signal input, and replacing subsystem 22 by a ROM 50 that has an address input and a data output of sufficient data width. Furthermore, counter 52 has been designed to generate upcounting addresses for successively cycling through all its applicable states. Each of the parallel outputs of the ROM 50 can provide a respective one of the needed on-chip clock wave shape patterns. Since the ROM area is much smaller than that of the various circuits in FIG. 1 that it replaces, both power consumption and signal delay are decreased. No counterpart of sampling stage 28 is necessary anymore. In the case of the circuit specification being amended, the ROM can be replaced very easily through a late update, in that generally only a partially redesigned and reprogrammed mask must be provided.

In addition to blocks 50, 52, the integrated circuit arrangement has an output sampler 54, just as in FIG. 1, these three subsystems collectively constituting the clock generation kernel 56. Furthermore, the arrangement has three utility circuit blocks 58, 60, 62, each running at their own respective secondary reconfigured clock clk1, clk2, clk3, that may observe respective differences in frequency, duty-cycle, and wave pattern shapes. The overall arrangement may have been especially designed for portable telecom applications, and furthermore has a primary clock signal input terminal 64 for receiving a primary clock signal at a relatively low frequency f0. This primary clock feeds a clock upscaling facility 66 that is based on a Phase-Locked-Loop PLL, and which in this exemplary embodiment has been designed for frequency upscaling factor of n: f1=n*f0. In the presently preferred embodiment, the primary clock has been 13 MHz, whereas the upscaled intermediate clock had a frequency of 156 MHz. Skilled art persons will recognize applicable values both for f0 and for n, in particular, such as would be applicable in the field of mobile telecom. The upscaled frequency feeds counter 52 and sampler 54. For brevity, the utility application circuits 58, 60, 62, have not been detailed anymore further.

Figure 3:
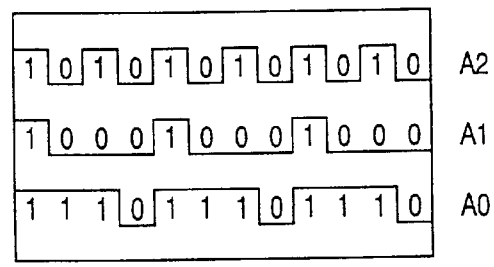
FIG. 3, various wave-shapes generated with the circuitry according to FIG. 2.

FIG. 3 illustrates various wave-shapes generated with the circuitry according to FIG. 2. Each horizontal row represents the sequential output bits on one of the ROM outputs, that are driven in sequence. By itself, the output frequency of the bits as stored is uniform, but not so the wave patterns and wave frequencies. As shown, wave shape A2 has a wave bit frequency of 0.5×f1, at a duty cycle of 50%. Likewise, wave shape A1 has a wave bit frequency of 0.25×f1, at a duty cycle of 25%. Likewise, wave shape A0 has a wave bit frequency of 0.25×f1, at a duty cycle of 75%. Many other patterns are feasible, both standard and non-standard, such based on the duty cycle, based on having multiple pulses per repetition cycle, and various other possibilities. Now, the ROM is very easy to handle since the various clocks can be mapped immediately on the ROM content as shown in the Figure.

Figure 4:
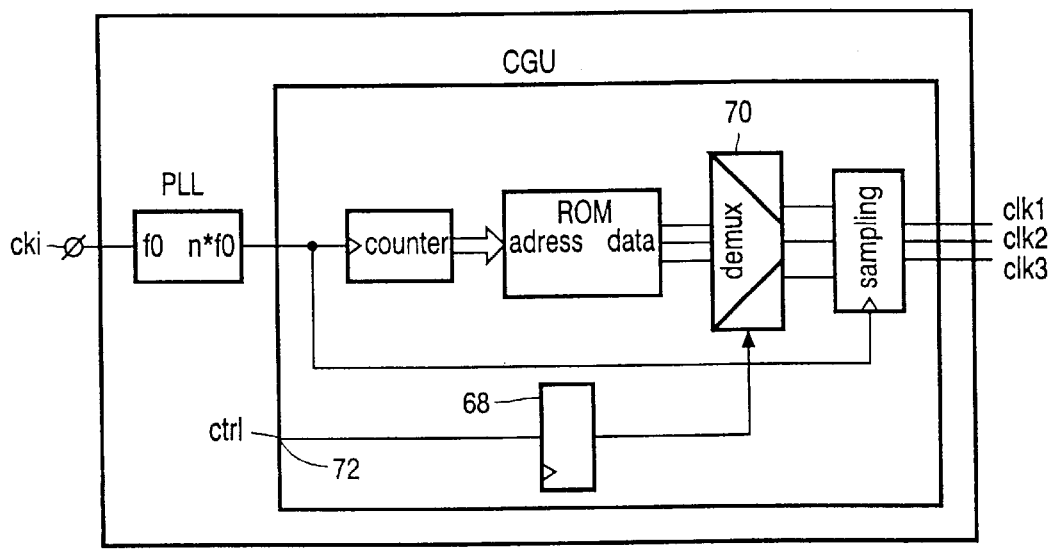
FIG. 4, a mixed-approach embodiment according to the present invention.

FIG. 4 illustrates a mixed-approach embodiment according to the present invention. This approach combines the advantages of both FIGS. 1 and 3, in that it may be used when a minimum selection possibility must remain viable. One situation would be where the ultimate arrangement must be useful in two different situations, so that the overall circuit is either used in a first frequency range, or in a second frequency range. The design has all essential elements of FIG. 3, combined with an additional demultiplexer 70, generally corresponding to item 30 in FIG. 1, and which is controlled through a signal on terminal 72, that is buffered in stage 68. For brevity, the remaining elements of the arrangement have been left unnumbered.

Figure 5:
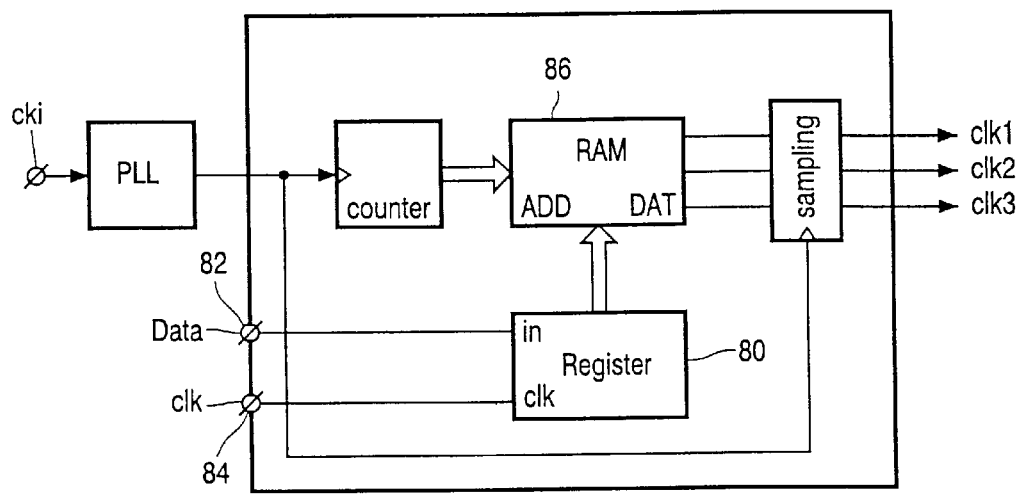
FIG. 5, a RAM-based embodiment according to the present invention.

FIG. 5 illustrates a RAM-based embodiment according to the present invention. A particular usage of such a solution would be an emulator circuit. At start-up, the table contents are loaded into register 80 that is provided with conventional data terminal 82 and clock terminal 84 for subsequently writing into RAM 86. For the remainder, the elements of the arrangement correspond to those of FIG. 2, and have they been left unnumbered for brevity. Persons skilled in the art will appreciate various amendmends and combinations, such as a mixed RAM/ROM solution, all these lying in the scope of the appended claims.

What is claimed is:

1. An integrated circuit comprising clock input means for receiving a primary clock signal, clock reconfiguring means fed by said clock input means for generating one or more secondary reconfigured clock signals, and utility circuitry fed by said clock reconfiguring means for constituting application utility functions under synchronization by said secondary clock signals, being characterized in that said clock input means comprise clock upscaling means for from said primary clock signal generating an intermediate clock signal with an upscaled frequency for thereby feeding said clock reconfiguring means, said clock reconfiguring means comprising late-programmable and low power memory means driven by said intermediate clock signal for generating said secondary reconfigured clock signals as wave-shape patterns read-out from a plurality of separately and sequentially drivable memory locations.

2. An integrated circuit as claimed in claim 1, wherein said clock upscaling means are PLL-based.

3. An integrated circuit as claimed in claim 1, wherein said late-programmable memory means are ROM-based.

4. An integrated circuit as claimed in claim 1, wherein said late-programmable memory means are RAM-based.

5. An integrated circuit as claimed in claim 1, wherein said late-programmable memory means are arranged to feed demultiplexer means (70) under control of an associated control signalization (72) for selectively and statically transferring only a subset of all wave-shape patterns stored for synchronizing said application utility functions.

6. An integrated circuit as claimed in claim 1, wherein said application utility is mobile telecom.

7. An integrated circuit as claimed in claim 1, wherein said wave-shape patterns define various duty cycle values and/or non-standard wave shapes.

8. An integrated circuit as claimed in claim 1, wherein said application utility functions represent diverse clock domains on a single integrated substrate.

* * * * *

UNITED STATES PATENT AND TRADEMARK OFFICE
CERTIFICATE OF CORRECTION

PATENT NO. : 6,636,096 B2
DATED : October 21, 2003
INVENTOR(S) : Schaffer et al.

It is certified that error appears in the above-identified patent and that said Letters Patent is hereby corrected as shown below:

<u>Title page,</u>
Insert item:
-- [73]  Assignee: Koninklijke Philips Electronics N.V., Eindhoven (HL) --.

Signed and Sealed this

Ninth Day of March, 2004

JON W. DUDAS
*Acting Director of the United States Patent and Trademark Office*